(12) United States Patent
Sakamoto et al.

(10) Patent No.: US 6,962,868 B2
(45) Date of Patent: Nov. 8, 2005

(54) SEMICONDUCTOR INTEGRATED CIRCUIT DEVICE AND WIRING ARRANGING METHOD THEREOF

(75) Inventors: Shinsuke Sakamoto, Yokohama (JP); Yasuo Inbe, Yokohama (JP); Masakazu Yaginuma, Yokosuka (JP); Kazunari Horikawa, Yokohama (JP); Toshikazu Sei, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/879,723

(22) Filed: Jun. 30, 2004

(65) Prior Publication Data

US 2004/0227161 A1      Nov. 18, 2004

Related U.S. Application Data

(60) Division of application No. 10/081,109, filed on Feb. 25, 2002, now Pat. No. 6,844,630, which is a continuation of application No. 09/527,563, filed on Mar. 16, 2000, now abandoned.

(30) Foreign Application Priority Data

Mar. 16, 1999   (JP)   ................................. 11-069907

(51) Int. Cl.[7] ......................................... H01L 21/4763
(52) U.S. Cl. ...................... 438/622; 438/631; 438/669
(58) Field of Search .............................. 438/622, 631, 438/669, 598, 599; 257/776, 203, 208, 210, 257/211

(56) References Cited

U.S. PATENT DOCUMENTS

| | | | |
|---|---|---|---|
| 3,681,134 A | 8/1972 | Nathanson et al. | 117/212 |
| 4,136,356 A | 1/1979 | Kusano | 357/70 |
| 4,716,452 A | 12/1987 | Kondoh et al. | 357/68 |
| 5,019,889 A | 5/1991 | Shintani et al. | 357/42 |
| 5,031,072 A | 7/1991 | Malhi et al. | 361/387 |
| 5,260,597 A | 11/1993 | Orbach et al. | 257/529 |
| 5,534,732 A | 7/1996 | DeBrosse et al. | 257/776 |
| 5,581,098 A | 12/1996 | Chang | 257/211 |
| 5,679,967 A | 10/1997 | Janai et al. | 257/209 |
| 5,723,908 A | 3/1998 | Fuchida et al. | 257/758 |
| 5,903,490 A | 5/1999 | Rotem et al. | 365/63 |
| 6,459,136 B1 | 10/2002 | Amarilio et al. | 257/529 |

FOREIGN PATENT DOCUMENTS

JP      63318141      12/1998      ................. 257/776

*Primary Examiner*—Sara Crane
(74) *Attorney, Agent, or Firm*—Finnegan, Henderson, Farabow, Garrett & Dunner, L.L.P.

(57) ABSTRACT

Even where an I/O cell requiring good characteristics is alloted to an I/O slot corresponding to the uppermost standard pattern wiring, a pad can be connected to the I/O slot by forming rewiring in the chip outermost peripheral area.

11 Claims, 2 Drawing Sheets

SEMICONDUCTOR INTEGRATED CIRCUIT DEVICE AND WIRING ARRANGING METHOD THEREOF

CROSS-REFERENCE TO RELATED APPLICATION

This is a division of application Ser. No. 10/081,109, filed Feb. 25, 2002 now U.S. Pat. 6,844,630 (allowed), which is a continuation of application Ser. No. 09/527,563, filed Mar. 16, 2000 (abandoned), and claims priority of Japanese Patent Application No. 11-069907, filed Mar. 16, 1999, all of which are incorporated herein by reference.

BACKGROUND OF THE INVENTION

The present invention relates to a semiconductor integrated circuit device make use of an area pad and a wiring arranging method thereof.

A signal between a chip of a semiconductor integrated circuit and a package is inputted/outputted through a wiring arranged in an I/O slot of the chip and a wiring between input/output pads. An I/O cell, e.g., input/output buffer, is connected to the I/O slot. Each of the I/O slot and the wiring arranged in the I/O slot is called I/O slot herein later.

As shown in FIG. 3, an I/O slot 11 is arranged in a periphery of a chip 40, and a plurality of pads are arranged in a lattice form over the entire region of the chip 40. The pad arranged over the entire region of the chip 40, not only in a periphery of the chip 40, is called an area pad 12.

The area pad 12 is also arranged in a central portion of the chip 40. Therefore, the number of pads per chip 40 can be increased without unduly diminishing a pad pitch 41, compared with the case where the pads are arranged in only the periphery of the chip 40.

In an ASIC (Application Specific Integrated. Circuit), the I/O slot and the area pad arranged in the outer periphery of the chip are used as wirings that are generally formed on the uppermost layer. In the wiring pattern formed on the uppermost layer of the chip, redesign for each chip is not performed, and used is a standard pattern in which the connecting relationship between the wiring and the pad is designed in advance.

It is impossible to diminish the pad 12 in the design step. Further, the width of the I/O slot 11 is sufficiently small, compared with the pad 12. As a result, if the pads 12 are arranged in the adjacent I/O slots 11, these pads 12 are positioned contiguous to each other. To overcome this difficulty, the pad pitch 41 is set at a sufficiently large value as shown in FIG. 3.

The connection between the I/O slot and the area pad within the chip will now be described with reference to FIG. 4. The upper region of the drawing represents the chip inner area, with the lower region representing the outermost peripheral area of the chip.

As shown in FIG. 4, I/O slots 11a, 11b, 11c, 11d are arranged within the chip inner area. Pads 12a, 12b are arranged above the I/O slot 11a among these I/O slots 11a to 11d. The pad 12a is connected to the I/O slot 11a via a wiring 14 and a via 15. Likewise, the pad 12b is connected to the I/O slot 11b via a wiring 17 and a via 18. These wirings 14, 17 constitute the standard pattern of the uppermost layer of the chip inner area.

Defect analyzing pads 13a, 13b are arranged in the chip outermost peripheral area. The wiring 14 is connected to the defect analyzing pad 13a through the via 15 and a wiring 16. Also, the wiring 17 is connected to the defect analyzing pad 13b through the via 18 and a wiring 19.

It should be noted that the pad 12a is positioned close to the peripheral portion of the chip; whereas, the pad 12b is positioned remote from the peripheral portion of the chip. As a result, the wiring 17 between the pad 12b and the via 18 is rendered long, though the wiring 14 between the pad 12a and the via 15 is short, as shown in FIG. 4.

As described above, the short wiring 14 and the long wiring 17 are formed in the standard pattern in the uppermost layer of the chip inner area. If the wiring is long like the wiring 17, problems such as delay of the signal transmission are generated. To be more specific, where an I/O cell requiring a high speed performance is alloted to the I/O slot 11b to which is connected the long wiring 17, a delay of signal transmission takes place. It follows that it is necessary to change the position of the I/O slot requiring a high speed performance to the position of the I/O slot 11a to which is connected the short wiring 14. However, the chip must be redesigned for changing the position of the I/O slot, leading to a high manufacturing cost.

BRIEF SUMMARY OF THE INVENTION

An object of the present invention, which has been achieved for overcoming the above-noted difficulty inherent in the prior art, is to provide a semiconductor integrated circuit device and a wiring arranging method thereof, which permits connection of an optional I/O slot without changing the wiring pattern within the chip.

According to a first aspect of the present invention, there is provided a semiconductor integrated circuit device, comprising a plurality of I/O slots arranged in parallel along the peripheral portion of a chip within the inner region of the chip and having input/output cells connected thereto, a plurality of pads arranged a predetermined distance apart from each other above the I/O slot and extending from the peripheral portion of the chip toward the central portion, a plurality of first wiring each having one end positioned in the pad and having the other end positioned in the peripheral region of the inner portion of the chip above the I/O slot, and a second wiring arranged in the outermost peripheral region of the chip and serving to connect the other end of each of the plural the first wiring to a predetermined I/O slot.

The second wiring is arranged between the first wiring and the first I/O slot. One end of the second wiring is connected to the first wiring arranged in the second I/O slot, with the other end being connected to the first I/O slot.

According to a second aspect of the present invention, there is provided a method of connecting the wiring of a semiconductor integrated circuit device for connecting a plurality of I/O slots arranged in parallel along the peripheral portion of a chip within the inner region of the chip and having input/output cells connected thereto to a plurality of pads arranged a predetermined distance apart from each other above the I/O slot and extending from the peripheral portion of the chip toward the central portion, comprising the steps of connecting each of the pads to the peripheral portion above the I/O slot in the inner region of the chip, and connecting the peripheral portion in the inner region of the chip to a desired I/O slot in the outermost peripheral region of the chip.

As described above, the present invention provides a semiconductor integrated circuit device and a wiring arranging method, which make it possible to achieve connection of an optional I/O slot without changing the wiring pattern within the chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
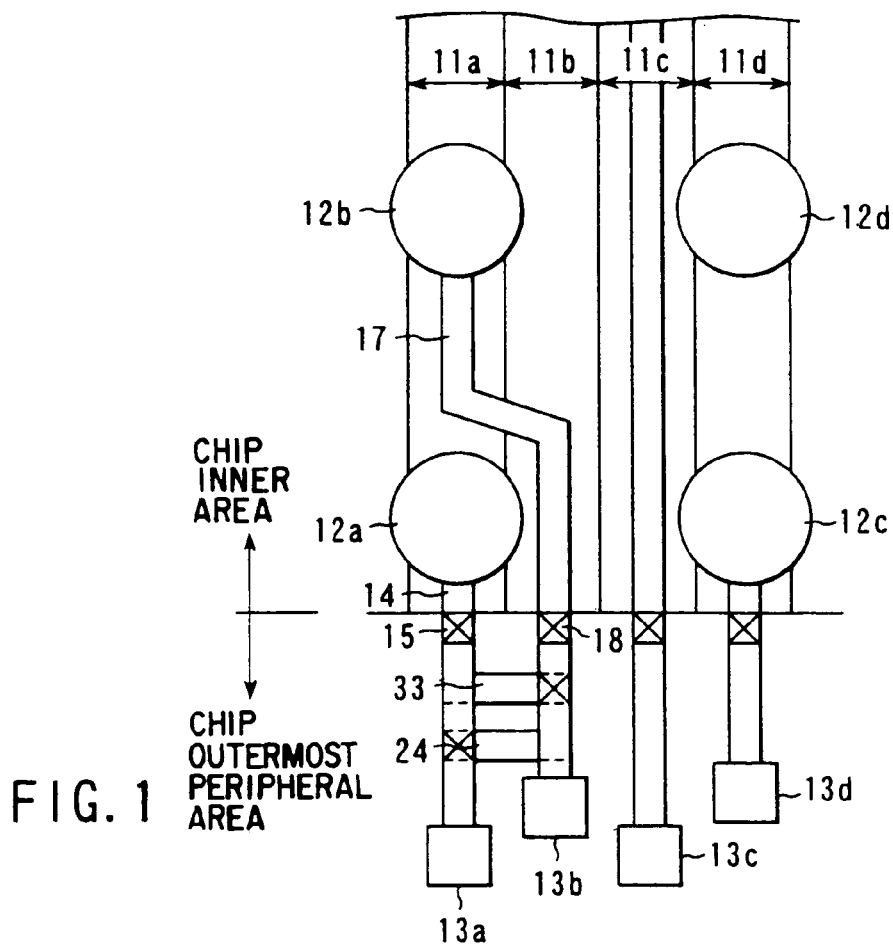
FIG. 1 is a plan view showing a semiconductor integrated circuit device according to one embodiment of the present invention.

A semiconductor integrated circuit device of the present invention will now be described with reference to the accompanying drawings. As shown in FIG. 1, specifically, I/O slots 11a, 11b, 11c and 11d are arranged in the chip inner area. Pads 12a, 12b are arranged above the I/O slot 11a among these I/O slots 11a to 11d. Also, pads 12c, 12d are arranged above the I/O slot 11d. The pad 12a is connected by the wiring 14 to the via 15 formed in the chip outermost peripheral area. Likewise, the pad 12b is connected by the wiring 17 to the via 18 formed in the outermost peripheral area. These wirings 14, 17 constitute the standard pattern of the uppermost layer of the chip inner area. Further, defect analyzing pads 13a, 13b, 13c, 13d are arranged in the chip outermost peripheral area.

In this embodiment, the pads 12a and 12b can be connected to the I/O slots 11b and 11a, respectively, by using rewiring 24, 33 formed in the chip outermost peripheral area. The connection of the pad 12a to the I/O slot 11b and the connection of the pad 12b to the I/O slot 11a will now be described.

Figure 2:
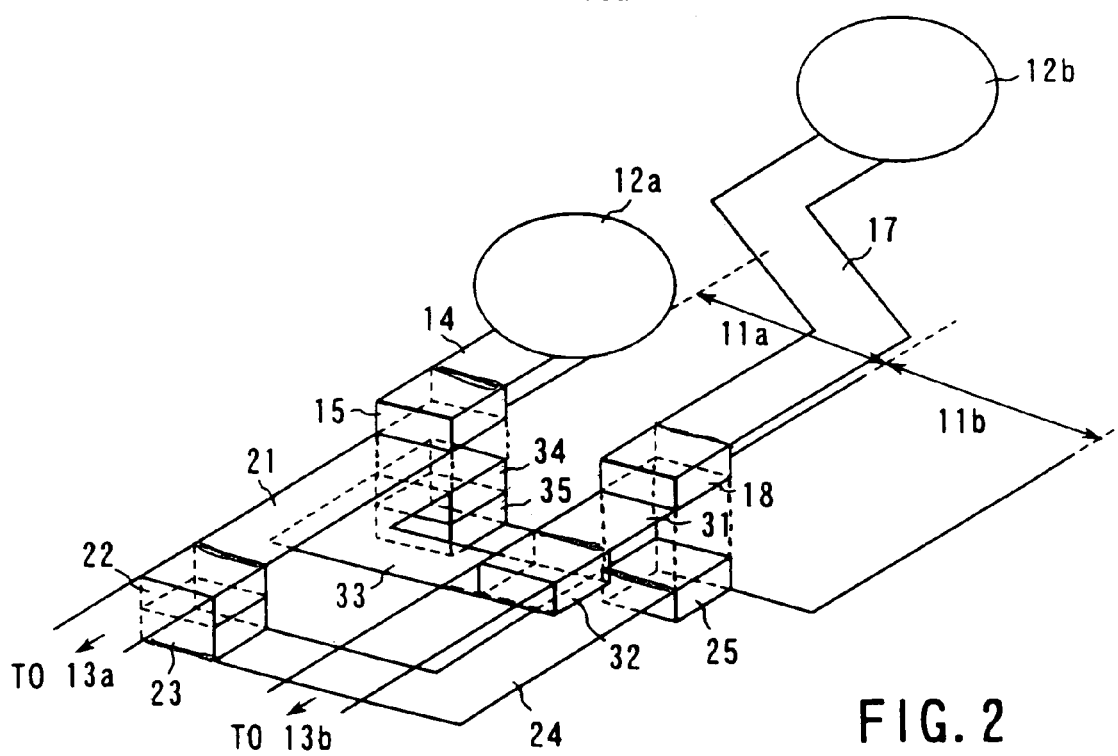
FIG. 2 is an oblique view showing the rewiring of the chip outermost peripheral area.
Figure 3:
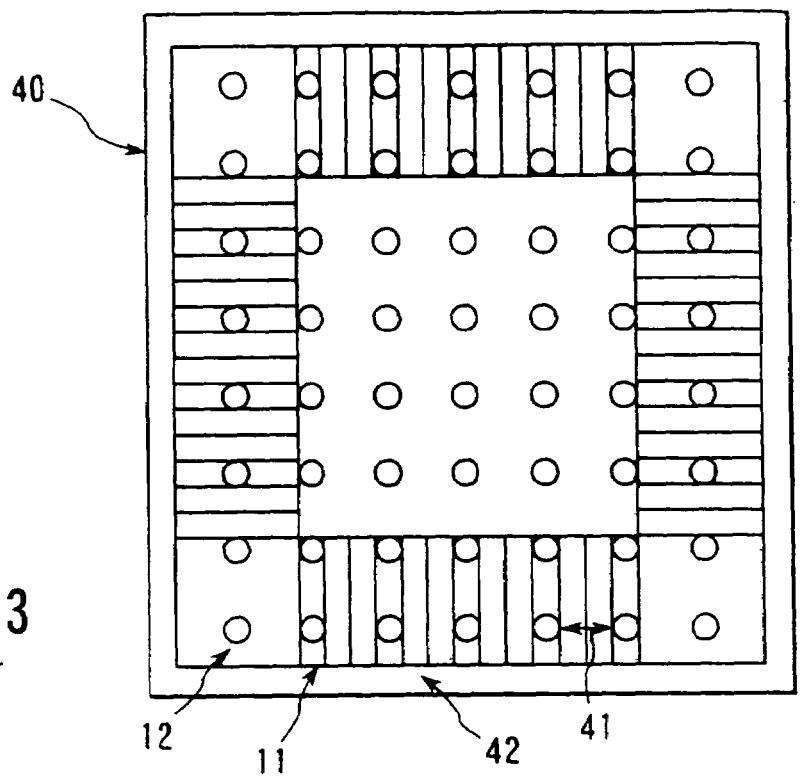
FIG. 3 is a plan view showing a chip having an area pad arranged therein.
Figure 4:
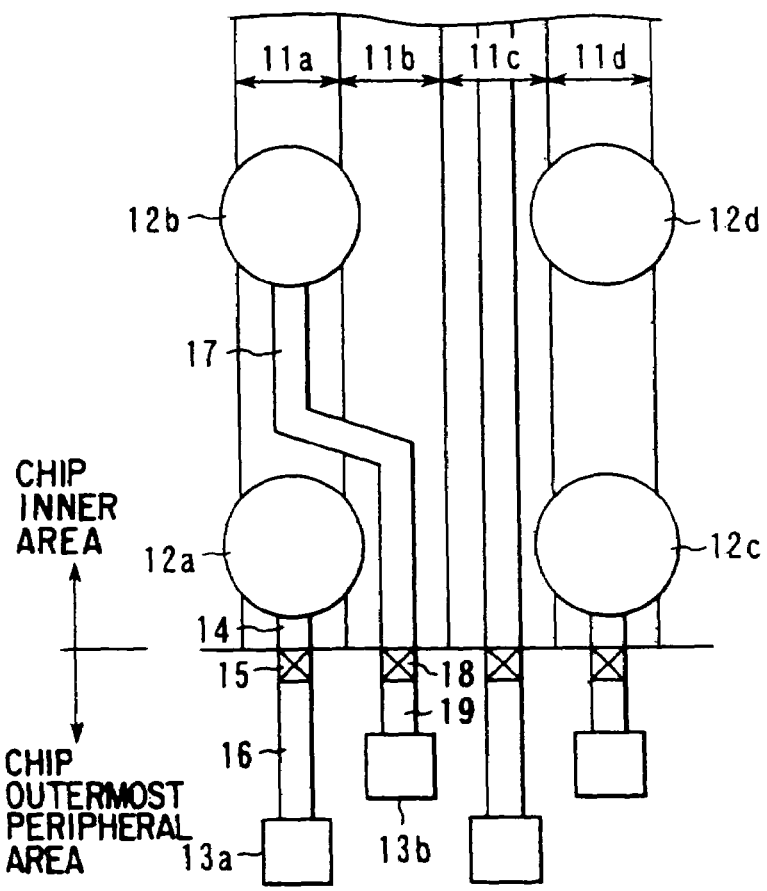
FIG. 4 is a plan view showing a conventional semiconductor integrated circuit device.

FIG. 2 is an oblique view showing the rewiring portion in the chip outermost peripheral area, covering, for example, a 5-layered metal wiring.

As shown in FIG. 2, the pad 12a is connected by a fifth layer metal wiring 14 to the via 15. The via 15 permits the wiring 14 to be connected to one end of the outermost peripheral pad wiring 21 on the fourth layer metal, and the other end of the outermost peripheral pad wiring 21 is connected to a via 22. The via 22 is formed to reach the position of the third layer metal. Also, a via 23 is formed to extend from the third layer metal to reach the second layer metal. In other words, the outermost peripheral pad wiring 21 of the fourth layer metal is connected to one end of the rewiring 24 of the second layer metal by the presence of the vias 22, 23. The other end of the rewiring 24 is connected to a via 25. The rewiring 24 of the second layer metal is connected to the I/O slot 11b through the via 25. As described above, the pad 12a can be connected to the I/O slot 11b.

The pad 12b is connected to a via 18 through a fifth layer metal wiring 17. The via 18 permits the wiring 17 to be connected to one end of the outermost peripheral pad wiring 31 of the fourth layer metal. The other end of the outermost peripheral pad wiring 31 is connected to a via 32. The via 32 is connected to one end of the rewiring 33 of the third layer metal, and the other end of the rewiring 33 is connected to the via 34. The via 34 is formed to extend from the third layer to reach the second layer, and the via 35 is formed to extend from the second layer to reach the first layer. The via 35 is connected to the I/O slot 11a. In other words, the vias 34 and 35 collectively serve to connect the third layer rewiring 33 to the I/O slot 11a. In this fashion, the pad 12b can be connected to the I/O slot 11a.

A via for connecting the third layer metal to the fourth layer metal positioned between the vias 15 and 34 is not formed. A via for connecting the second layer metal to the third layer metal positioned between the vias 18 and 25 is not formed, either. Likewise, a via for connecting the third layer metal to the fourth layer metal positioned between the vias 18 and 25 is not formed.

The wiring 14 is connected to the defect analyzing pad 13a through the via 15 formed in the chip outermost peripheral area, the rewiring 21, etc. Also, the wiring 17 is connected to the defect analyzing pad 13b through the via 18, the outermost peripheral pad wiring 31, etc.

As described above, the wiring length of the I/O slot can be shortened by the rewiring 24, 23 on the outermost periphery of the chip, and the delay in the signal transmission can be improved by the shortening of the I/O slot wiring. The improvement of the delay in the signal transmission will now be described.

Specifically, the pads in the central region of the chip ranging from the outermost periphery of the chip to, for example, the ninth column, which are selected from the area pad arranged over the entire chip, are connected to the I/O slot. The pads in the central portion of the chip are utilized as a power source and the ground terminal. It should be noted that, since the width of the I/O slot is sufficiently small, compared with the pad pitch between adjacent area pads arranged above the same slot, the wiring length of the rewiring corresponding to the slot width can be neglected.

It follows that the wiring length between the I/O slot in the uppermost standard pattern and the area pad can be shortened to $8 \times P_1$ by allotting the I/O slot to which is allotted the pad on the ninth column from the chip outermost periphery to the pad on the first column from the chip outermost periphery, said $P_1$ denoting the pad pitch between adjacent area pads, which is determined by the kind of the package of the standard pattern. To be more specific, where the pads from the chip outermost periphery to the n-th column are allotted to the I/O slot, the wiring length can be shortened by $(n-1) \times P_1$. Since the delay in the signal transmission is proportional to the wiring length, the delay in the signal transmission can be improved by $(n-1) \times P_1$.

What should be noted is that a pad having a small delay in the signal transmission can be allotted by the rewiring of the chip outermost periphery to the I/O slot to which is allotted an I/O cell severe in the timing restriction such as an input buffer having a flip-flop circuit connected thereto or an output buffer having a small driving capacity, making it possible to avoid the delay in the signal transmission.

As described above, the rewiring 24, 33 are formed in the chip outermost periphery in this embodiment of the present invention. In other words, an optional I/O slot can be connected without changing the wiring pattern within the chip by the rewiring in the chip outermost peripheral area. Therefore, it is possible to use the conventional mask on the chip uppermost layer and the conventional built-up substrate of the package as they are, making it possible to prevent the manufacturing cost from being increased.

Also, the I/O cell allotted to the I/O slot 11b can be connected to the pad 12a by using the rewiring 24, 33. In other words, even where an I/O cell requiring good characteristics is allotted to the I/O slot 11b, the pad 12a small in delay time and having good characteristics can be allotted to the I/O cell. It follows that in the I/O slot in which the wiring length has been shortened, the delay in the signal transmission can be improved by the time corresponding to the shortening of the wiring length.

Incidentally, the I/O slot to be replaced is not limited to the adjacent slot. For example, the rewiring 24, 23 as shown in FIG. 1 can be extended to reach the wiring in the outermost peripheral area such as the I/O slots 11c and 11d. It is also possible to interchange the I/O slots apart from each other by at least two slots.

The embodiment described above is directed to a chip having a 5-layered metal wiring as shown in FIG. 2. However, the present invention is not limited to the particular structure. For example, the technical idea of the present invention can be applied to a chip in which the metal wiring is of a multi-layered structure having at least three layers. To be more specific, the uppermost standard pattern wiring 14, 17 and the outermost peripheral wiring 21, 31 can be made to form the uppermost layer without forming the vias 15, 18. It is also possible to make the rewiring 33 the second lowermost layer or the intermediate layer and to make the I/O slots 11a, 11b and the rewiring 24 the lowermost layer without forming the vias 25, 35.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of connecting wiring of a semiconductor integrated circuit device, said semiconductor integrated circuit device comprising first and second I/O slots arranged on a same wiring level in parallel along a peripheral portion of a chip within an inner region of the chip, a first pad arranged on a wiring level different from the first I/O slot and arranged above the first I/O slot, a second pad arranged on a wiring level different from the first I/O slot and arranged apart from the peripheral portion of the chip as compared with the first pad, a first wiring arranged in the inner region, which comprises a first end positioned at the first pad and a second end positioned at the peripheral portion above the first I/O slot, second wiring arranged in the inner region, which comprises a third end positioned at the second pad and a fourth end positioned at the peripheral portion above the second I/O slot, and a third wiring arranged in an outermost peripheral region of the chip, said method comprising:

connecting the first pad to the first end in the inner region;

connecting the second pad to the third end in the inner region; and connecting the second end to an I/O slot different from the first I/O slot via the third wiring in the outermost peripheral region.

2. The method of connecting the wiring of the semiconductor integrated circuit device according to claim 1, wherein the first and second I/O slots, the first and second pads and the first wiring and the second wiring are each designed and fixed in advance.

3. The method of connecting the wiring of the semiconductor integrated circuit device according to claim 1, wherein the first wiring and the second wiring are the same in wiring level.

4. The method of connecting the wiring of the semiconductor integrated circuit device according to claim 1, wherein the first wiring and the second wiring are arranged in an uppermost layer of the chip.

5. The method of connecting the wiring of the semiconductor integrated circuit device according to claim 1, wherein the I/O slot different from the first I/O slot is the second I/O slot.

6. The method of connecting the wiring of the semiconductor integrated circuit device according to claim 1, wherein the first and second pads are arranged on the same wiring level.

7. The method of connecting the wiring of the semiconductor integrated circuit device according to claim 1, wherein the first and second I/O slots are adjacent to each other.

8. The method of connecting the wiring of the semiconductor integrated circuit device according to claim 1, wherein the semiconductor integrated circuit device further comprises a fourth wiring arranged in the outermost peripheral region of the chip and serving to connect the first I/O slot to the fourth end.

9. The method of connecting the wiring of the semiconductor integrated circuit device according to claim 8, wherein the third wiring and the fourth wiring do not overlap.

10. The method of connecting the wiring of the semiconductor integrated circuit device according to claim 8, wherein the fourth wiring is shorter than the third wiring.

11. The method of connecting the wiring of the semiconductor integrated circuit device according to claim 8, wherein the third wiring is isolated from the second wiring, and the fourth wiring is isolated from the first wiring.

* * * * *